United States Patent

Lindemann et al.

[11] Patent Number: 6,066,911
[45] Date of Patent: *May 23, 2000

[54] ULTRASONIC DRIVING ELEMENT

[75] Inventors: Gert Lindemann, Lichtenstein; Klaus-Peter Schmoll, Lehrensteinsfeld; Gerhard Keuper, Leonberg; Jörg Wallaschek, Paderborn, all of Germany

[73] Assignee: Robert Bosch GmbH, Stuttgart, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/894,618
[22] PCT Filed: Feb. 23, 1996
[86] PCT No.: PCT/DE96/00301
§ 371 Date: Jan. 8, 1998
§ 102(e) Date: Jan. 8, 1998
[87] PCT Pub. No.: WO96/26551
PCT Pub. Date: Aug. 29, 1996

[30] Foreign Application Priority Data

Feb. 23, 1995 [DE] Germany .............. 195 06 203
Feb. 13, 1996 [DE] Germany .............. 196 05 214

[51] Int. Cl.[7] ............................... H01L 41/08
[52] U.S. Cl. ................ 310/323.02; 310/323.16; 310/328; 310/366; 310/358
[58] Field of Search .......... 310/328, 330–332, 310/323, 366, 323.02, 323.12, 323.16

[56] References Cited

U.S. PATENT DOCUMENTS

| | | | |
|---|---|---|---|
| 4,613,782 | 9/1986 | Mori et al. | 310/328 X |
| 4,639,630 | 1/1987 | Rodloff et al. | 310/328 |
| 4,950,135 | 8/1990 | Tojo et al. | 310/323 X |
| 5,027,028 | 6/1991 | Skipper | 310/323 X |
| 5,345,137 | 9/1994 | Funakubo et al. | 310/323 |
| 5,418,418 | 5/1995 | Hirano et al. | 310/328 |
| 5,814,919 | 9/1998 | Okumura | 310/323 |

FOREIGN PATENT DOCUMENTS

| | | | |
|---|---|---|---|
| 0129784 | 5/1989 | Japan | 310/366 |
| 0202381 | 8/1990 | Japan | 310/323 |
| 0202382 | 8/1990 | Japan | 310/323 |

*Primary Examiner*—Mark O. Budd
*Attorney, Agent, or Firm*—Kenyon & Kenyon

[57] ABSTRACT

An an ultrasonic drive element having a plurality of layers of piezoelectric material, arranged one on top of another to form a stack, between each of which is located a contacting layer for application of an operating voltage. Each of the contacting layers is subdivided into at least two electrically unconnected subregions, at least one of which has an electrode for making contact to the adjacent piezoelectric layers. By applying suitable alternating-current voltages to the electrode, the surface of the layer stack is excited into mechanical oscillations which contain a motion component parallel to the plane of said surface.

16 Claims, 11 Drawing Sheets c)

d)

a)

b)

ULTRASONIC DRIVING ELEMENT

FIELD OF THE INVENTION

The present invention relates to an ultrasonic drive element.

BACKGROUND INFORMATION

The piezoelectric effect has been used industrially for some time. In order to increase the displacement travel, elements constructed with the multilayer technique are often offered, for example by the PHYSIK INSTRUMENTE company in Catalog 107 of 1990. They consist of a plurality of thin piezoelectric layers, placed one on top of another, with a thickness of, for example, 20, to 500 um, between each of which an electrode layer is applied for electrical contacting. In a first embodiment having a large number of layers arranged one on top of another, such elements generate a linear motion by application of a direct-current voltage, and a linear oscillation by application of an alternating-current voltage. A second embodiment having in each case two laterally placed layers utilizes the secondary piezoelectric effect and yields a flexural motion when a direct-current voltage is applied, and a flexural oscillation when an alternating-current voltage is applied. A displacement effect going beyond the maximum linear stroke or maximum flexion cannot be achieved with these elements.

A rotatory ultrasonic drive having an unlimited displacement range has been disclosed by the SHINSEI company. It is based on an annular piezoceramic which is divided into two separately activatable excitation regions, each having 8 segments. By applying two alternating-current voltages, offset 90° from one another in time, to the two excitation regions, a flexural traveling wave is generated in a stator adhesively bonded to the piezo ring. This can be used, by way of a friction layer, to drive a rotor. Other improvements to traveling-wave motors operating on the principle of the SHINSEI motor have been disclosed.

The traveling-wave principle is well-suited for rotatory motions, but it is unsuitable for linear drives. Attempts to implement a linear ultrasonic traveling wave motor by cutting open the piezo ring used in the SHINSEI motor have failed. The reasons for this are, in particular, the reflections which occur at the ends of the cut-open piezo structure, which disrupt the energy flux transported with the traveling wave and thus the entire motion. Many attempts to prevent the reflections and generate a traveling wave in a finite piezoelectric beam have so far yielded no industrially exploitable solutions.

Disclosed solutions for carrying out a linear drive mechanism are based on the use of discrete individual actuators which are excited by the application of suitable voltages in such a way that an elliptical motion for a surface point results. According to a solution described in European Patent Application No. 297 574, two mutually perpendicular longitudinal oscillations are used for this purpose; U.S. Pat. No. 4,763,776, provides two mutually perpendicular flexural oscillations.

It is an object of the present invention to provide an easily handled ultrasonic motor which is suitable for linear displacement motions.

SUMMARY OF THE INVENTION

This object is achieved by providing an ultrasonic drive element. The ultrasonic drive element according to the present invention offers an advantage that it can be manufactured easily and with a great variety of forms. Driving can occur in such a way that the surface points which are pressed against the element being driven execute elliptical motions; and also using a plunger mechanism whereby the surface points execute a plunger motion against the part being driven. In both cases, it is easy to reverse the motion. The ultrasonic drive element according to the present invention provides additional advantages based on the principles of the ultrasonic driver element. In particular, driving can take place directly, i.e. without a gear train. High forces, on the order of $10^2$ N, are possible, along with low velocities on the order of 10 mm/s. The installation space required is small by comparison with the power output.

One of the underlying principles for the drive element according to the present invention is to configure the electrical contacting of the piezoelectric layers in such a way that specific excitation of certain mechanical oscillations is possible. In a first embodiment, the contacting layers are each subdivided into subregions, in each of which an electrode is configured which can be activated separately. By applying alternating-current voltages that have been suitably phase-shifted with respect to one another to the electrodes, the piezoelectric layers can be selectably excited into longitudinal, flexural, or elliptical oscillations.

An alternative possibility for exciting longitudinal or flexural oscillations in adjacently located regions of a piezoelectric layer provides, for example, for longitudinal oscillations to be excited in the upper region of a drive element, and flexural oscillations in the lower region. A further alternative provides, for example, for longitudinal oscillations to be excited in the inner regions of a drive element, and flexural oscillations in the outer region of a drive element.

To implement a particularly effective drive, an excitation of the longitudinal/flexural oscillations can occur in resonant fashion. In order to suppress undesired energy exchange between the two oscillation forms, the drive element is advantageously dimensioned so that the natural frequencies of the two oscillation forms are far apart. Advantageously, the dimensioning is such that the ratio of the natural frequencies to one another is integral. Another advantageous way of making possible simultaneous resonant excitation of longitudinal and flexural oscillations is to excite the flexural oscillations in the second flexural mode. The result is not only the capability for simultaneous resonant excitation of both oscillation forms, but also the advantage of reduced noise production.

It is advantageous to embody drive elements in the form of multiple piezoelectric layers stacked into turrets, which are arranged in crenellated fashion next to one another, and are activated in mutually tuned fashion. Especially large forces can be applied in this manner. In addition, with the use of the turret concept it is easy to implement rotatory drives as well, by arranging the turrets in annular fashion. Another embodiment according to the present invention provides for turrets arranged one next to another, which additionally are joined by turret-like bridge stacks which are of lesser height. In this embodiment, the turrets and bridge stacks are each excited only to longitudinal oscillations.

In yet another embodiment according to the present invention, only a portion of each piezoelectric layer is electrically contacted in each case, while the remaining portion is not electrically contacted. With the resulting asymmetrical contacting, both flexural and linear oscillations can easily be excited by means of only a single alternating-current voltage.

An advantageous variation of this embodiment provides for each layer to be subdivided into three separately contacted subregions, the two outer ones being activated so that they oscillate in opposite directions. The center region is activated in phase with one or the other outer region depending on the desired direction of motion.

BRIEF DESCRIPTION OF THE DRAWINGS

FIG. 7a shows a side view of the drive element configured in a V-shape.

FIG. 7b shows a prospective view of the drive element illustrated in FIG. 7a.

FIG. 8a shows a side view of the drive element excitable in a single manner, along with oscillation patterns.

FIG. 8b shows a top view of a subregion of the drive element illustrated in FIG. 8a.

FIG. 8c shows a first movement position of the oscillations relating to the drive element illustrated in FIG. 8a.

FIG. 8d shows a second movement position of the oscillations relating to the drive element illustrated in FIG. 8a.

DETAILED DESCRIPTION OF THE DRAWINGS

Figure 1:
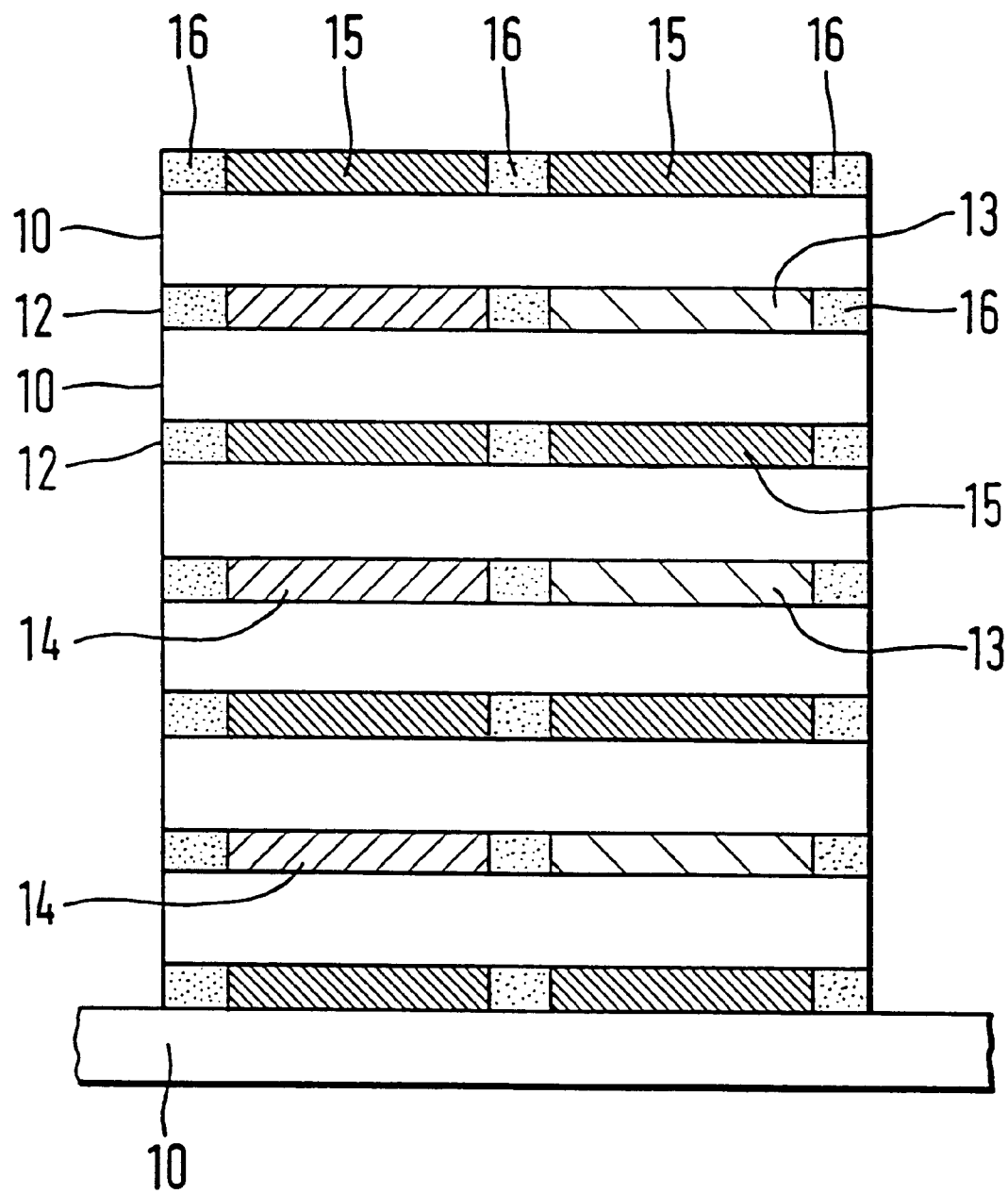
FIG. 1 shows the construction of a multilayer drive element according to the present invention.

FIG. 1 illustrates the structural principle of a drive element according to the present invention. It is created by alternately layering on top of one another layers 10 of piezoelectric material, hereinafter called piezo layers, and contacting layers 12 for electrical contacting of the piezoelectric layers 10. Contacting layers 12 are each subdivided into at least two electrically separate regions. They are composed of regions of electrically conductive electrode material, and regions of nonconductive filler material. The regions of an electrically conductive electrode material define electrodes 13, 14, 15 for excitation of piezoelectric layer 10. The filler material is applied to points 16 where no electrode is intended to be located, and serves in particular to subdivide contacting layers 12. Via electrical supply leads (not depicted), a first voltage $U_1$ is applied to electrodes 13 configured in contacting layers 12, a second voltage $U_2$ to electrodes 14, and ground potential $U_G$ to electrodes 15.

A layered arrangement 10 to 16 as shown in FIG. 1 can be manufactured as follows: A suitable base material, for example lead zirconate titanate ($Pb(Zr_xTi_{1-x})O_3$, where x=0.4 to 0.6), or alternatively a material deriving from the complex ternary systems (such as perhaps $PbZiO_3$—$Pb(Me_{1/3}Nb_{2/3})O_3$ where Me=Mg, Mn, Co, such that the Pb can be partially substituted by Ba or Sr), is first processed into a fine powder. This is mixed with an organic binder material, plasticizers, and aqueous or organic solvents into a dispersion, called a "slurry." The slurry is then cast by means of a casting apparatus to yield a film; the solvent is evaporated off in the drying duct adjacent thereto. The result is a film that is in particular characterized by great flexibility, called the "green film." Planar electrodes are now applied onto the green film, preferably by silk-screening. The desired stacked structure, with internally located electrodes, is obtained by subsequent stacking, pressing, and cutting of the films. The binder is burned out of the resulting green multilayer, and sintering is then performed in the same firing. Lastly, the completed piezoceramic element can be polarized by means of the internally located electrodes.

The drive element constructed as shown in FIG. 1 is, according to a first embodiment according to the present invention, excited in nonresonant, two-phase fashion. Thus, alternating-current voltages $U_1$, $U_2$, shifted 90° in phase from one another and having, for example, the following form:

$U_1 = U_0 * \sin(\omega t)$ and $U_2 = U_0 * \cos(\omega t)$ or, written differently:

$U_1 = U_0 * \sin(\omega t - 45°)$ and $U_2 = U_0 * \sin(\omega t + 45°)$, where $U_0$ is amplitude, are applied to the electrode pairs 13/15 and 14/15, respectively.

The excitation is typically performed at high frequency in the ultrasonic range, with frequencies of, for example, $f = \omega/2\pi > 20,000$ Hz, which is nonresonant, i.e. the frequency of the electrical excitation is not equal to the mechanical natural frequencies of the drive element. The latter are generally higher than the excitation frequency; excitation is noncritical. In this case, the drive element tracks the excitation frequency directly, with no phase distortion. At least two different oscillations are excited in the drive element by the two voltages $U_1$, $U_2$. These voltages are superimposed in the drive element, with the result that points on the surface of the drive element execute an elliptical motion. The traverse direction of the ellipse depends on which of the voltages $U_1$ or $U_2$ leads the other by 90°. Reversal of the motion is achieved by rotating one of the voltages.

FIG. 2a shows a first embodiment of a drive element according to the present invention constructed using the multilayer technique. The drive element includes a plurality of stacks of piezoelectric and contacting layers, embodied in the form of turrets 20. All the turrets 20 are interconnected by means of a base 31 which contains at least one (and possibly more than one) continuous piezoelectric layers 30. A plurality of turrets 20, arranged in crenellated fashion next to one another along an extension direction R, constitute in each case a drive element in the form of a multipiezo actuator.

As illustrated in FIG. 2b, contacting layers 12 arranged between piezoelectric layers 10 are each subdivided into two regions 101, 102, each of which constitutes a separately activatable electrode. The two regions 101, 102 will be referred to hereinafter as left region 101 and right region 102, respectively. A voltage $U_1$ is applied to the respective electrodes of a turret 22 configured in the left regions 101 of contacting layers 12, and a voltage $U_2$ to the right electrodes 102. If, for example, piezoelectric layers 10 are polarized in the same direction, left electrodes 101 and right electrodes 102 are each excited with identical voltages with no phase shift, turrets 22 execute a longitudinal oscillation. If, on the other hand, electrodes 101 and 102 are excited with voltages that are identical but shifted 180° out of phase with one another—for example $U_1 = -\sin(\omega t)$, and $U_2 = \sin(\omega t)$—the result is a flexural oscillation. In order to excite both oscillation forms simultaneously, voltages shifted 90° out of phase, for example $U_1 = \sin(\omega t - 45°)$ $U_2 = \sin(\omega t + 45°)$ are applied to left electrodes 101 and right electrodes 102, respectively.

The longitudinal oscillations H and flexural oscillations B that are thereby excited simultaneously are superimposed on one another, and cause surface 21 of a turret 22 to execute an elliptical motion with a component H perpendicular to surface 21 of turret 22 and a component B parallel to extension direction R of the turret row. The resulting elliptical motion for a point P on the surface of turret 20 is indicated above the left turret in FIG. 2b. The component therein parallel to surface 21 of turret 22 can, in known fashion, be used to drive an object that is moved. In accordance with the indicated position of the ellipse, direction X of the resulting motion of an object being driven then extends parallel to extension direction R of the turret row, as indicated by the arrow on the right turret.

Because of the oscillation excitation occurring separately in each turret 22, a single turret already executes a linear motion. The use of a turret row as indicated in FIG. 2a is a convenient way to establish a desired force; moreover, this improves the linearity of the motion.

Figure 2:
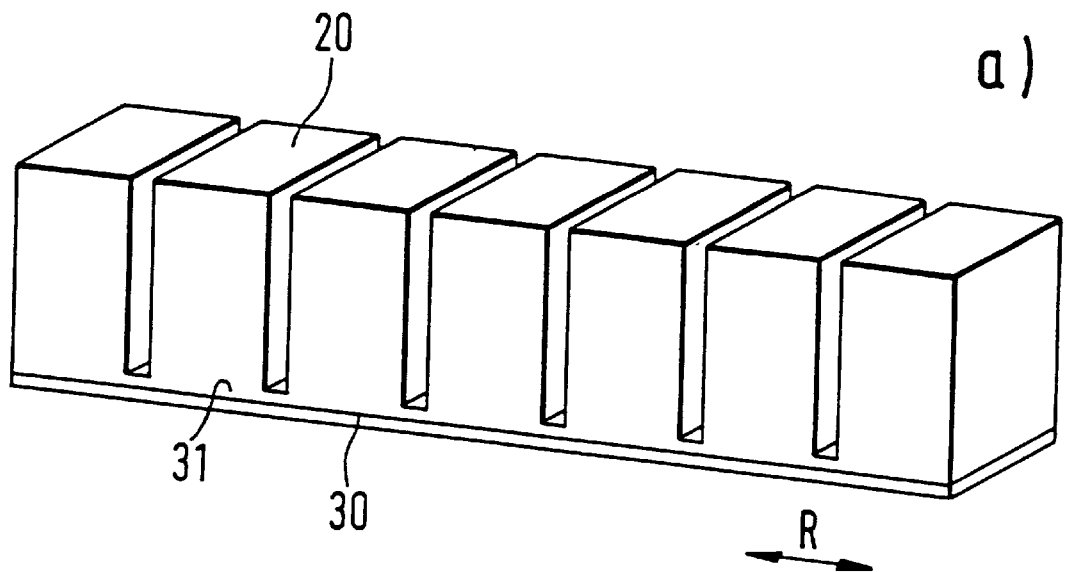
FIG. 2a shows a first embodiment of a drive element constructed from multiple turrets.
FIG. 2b shows a second embodiment of the drive element constructed from the multiple turrets.
FIG. 2c shows a third embodiment of the drive element constructed from the multiple turrets.
FIG. 2d shows a fourth embodiment of the drive element constructed from the multiple turrets.
Figure 2:
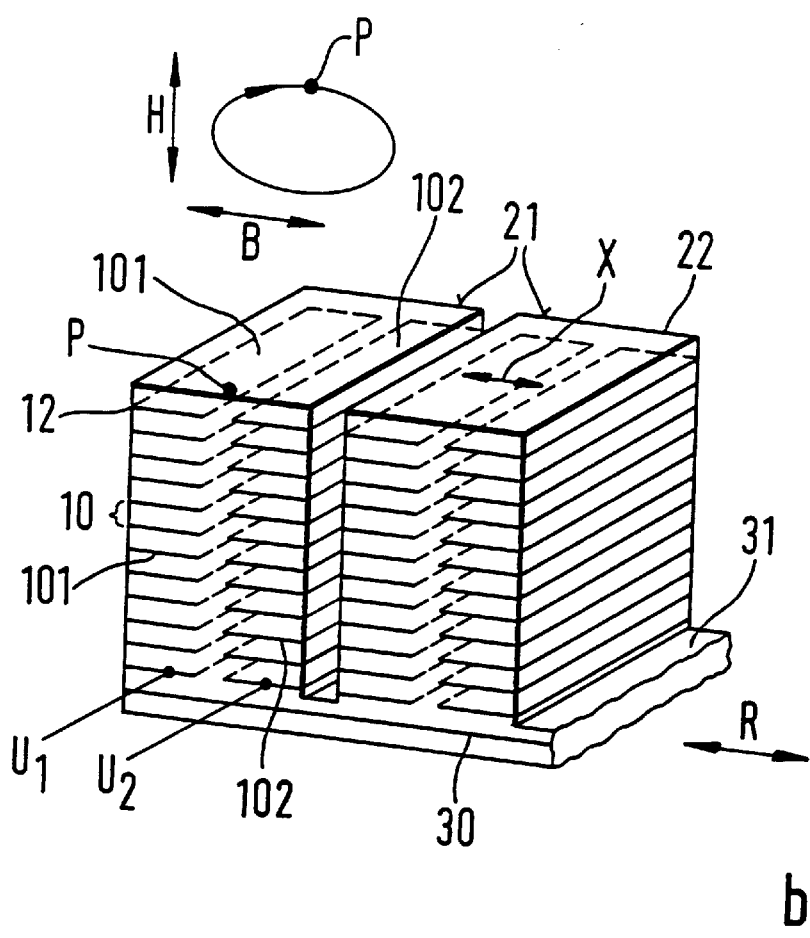
Figure 2:
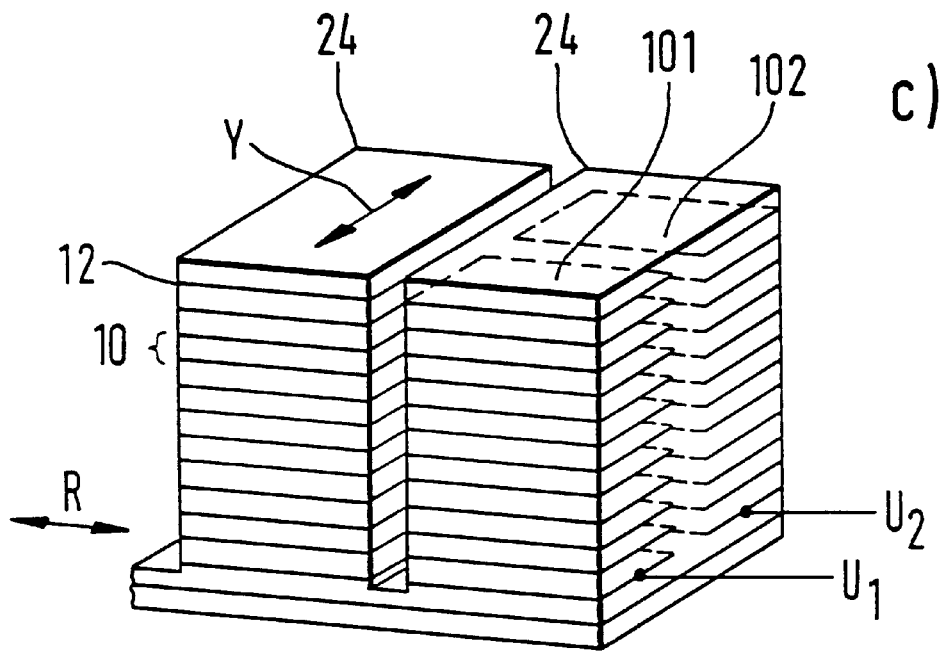
Figure 2:
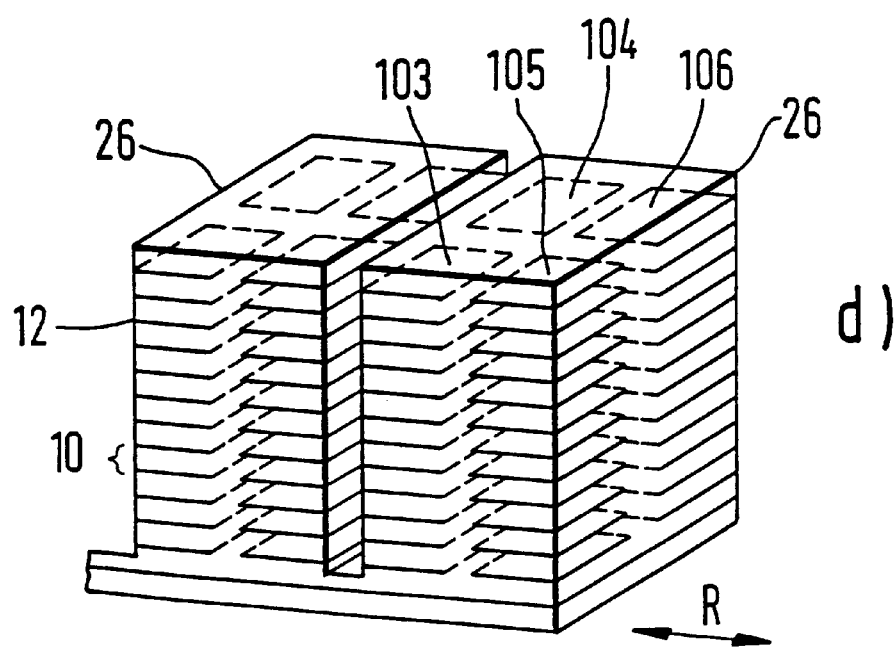

The turret concept depicted in FIG. 2 allows for a number of advantageous variants. For example, contacting layers 12 can be divided into regions not just perpendicular to extension direction R to produce a left/right division, but also, as shown in FIG. 2c, parallel to direction R to produce a front/rear division. As a result, as indicated by the arrow on left turret 24, output drive direction Y is also rotated 90° as compared with what is obtained with a left/right arrangement. Direction Y is then perpendicular to extension direction R of the turret row.

It may also be advantageous to divide each contacting layer 12 into four regions—right front 105, right rear 106, left front 103, left rear 104—as indicated in FIG. 2d. In this fashion, motions can be generated both parallel to extension direction R of a row of turrets 26, and also perpendicular thereto. With an appropriate activation, the basic output drive directions X, Y can be superimposed to yield an overall motion in any desired direction in the plane parallel to the turret surface.

The variety of possible motions can be further expanded by arranging turrets in fields. If, for example, 10×10 individually activatable turrets are arranged in such a field, an object driven above it can be moved in two translational spatial directions. In addition, a rotation about the axis orthogonal to the translational directions can be superimposed on the translational movement.

Figure 3:
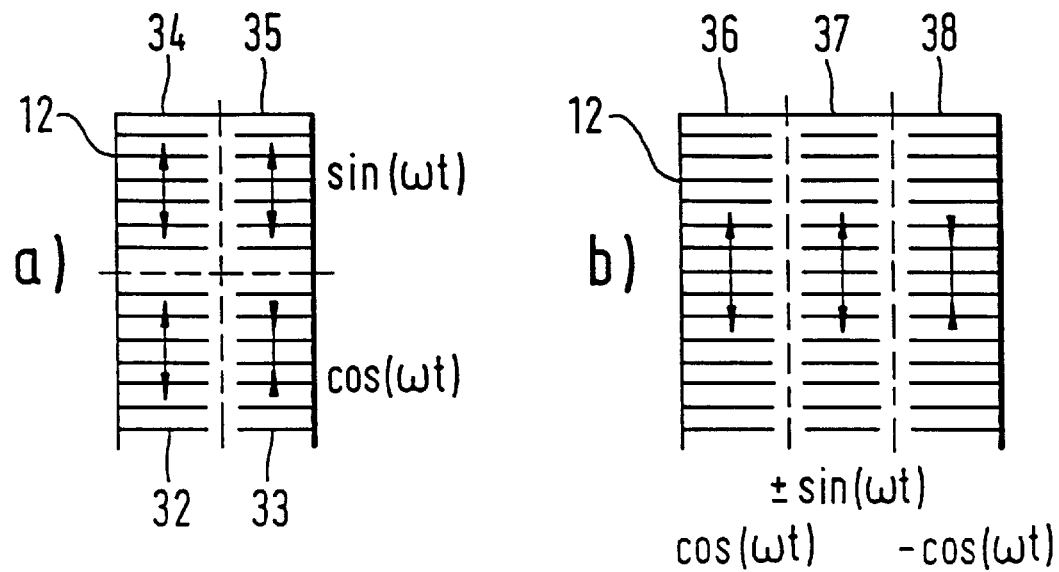
FIG. 3a shows a first division of excitation regions.
FIG. 3b shows a second division of the excitation regions.

According to another embodiment of the present invention, the longitudinal and flexural oscillations are excited not in one layer, but in spatially separated layers. Examples for this variant are shown in FIGS. 3a and 3b. In the arrangement shown in FIG. 3a, voltages $\cos(\omega t)$ and $-\cos(\omega t)$, shifted 180° in phase from one another, are applied to the lower regions 32, 33 of the turret; and voltages $\sin(\omega t)$ of identical phase, but shifted 90° in phase with respect to those applied to the lower regions, 32, 33 are applied to upper regions 34, 35. As a result, flexural oscillations as indicated by double arrows in opposite directions are excited in the lower part of the turret, and longitudinal oscillations, indicated by double arrows in the same direction, are excited in the upper region. In the embodiment shown in FIG. 3b, center region 37 executes longitudinal oscillations due to application of a voltage $\sin(\omega t)$, while flexural oscillations are excited between outer regions 36, 38 by the application of voltages $\cos(\omega t)$ and $-\cos(\omega t)$ that are shifted 180° in phase from one another.

A number of equivalent possibilities exist with regard to activating a drive element constructed with multiple turrets. In addition to activation of all the turrets in exactly the same direction, as depicted in FIG. 4a, they can also, as indicated in FIG. 4b, be activated in such a way that neighboring turrets 41, 42 behave oppositely to one another. While one half of the turrets 41 move, for example, to the right and upward, the other half of the turrets 42, the turrets located respectively between the turrets 41 move, are traveling back down and to the left. Activation of this kind can be implemented by increasing the number of excitation supply leads from two to four (the number of ground lines, not given further consideration here, is to be increased analogously) or, more favorably, by a suitable configuration of the electrodes and/or polarization of the piezo layers, only two supply leads then being required in unchanged fashion.

A further activation is possible, as shown in FIG. 4c, by activating the turrets so that their surfaces simulate a positively excited traveling wave.

Figure 4:
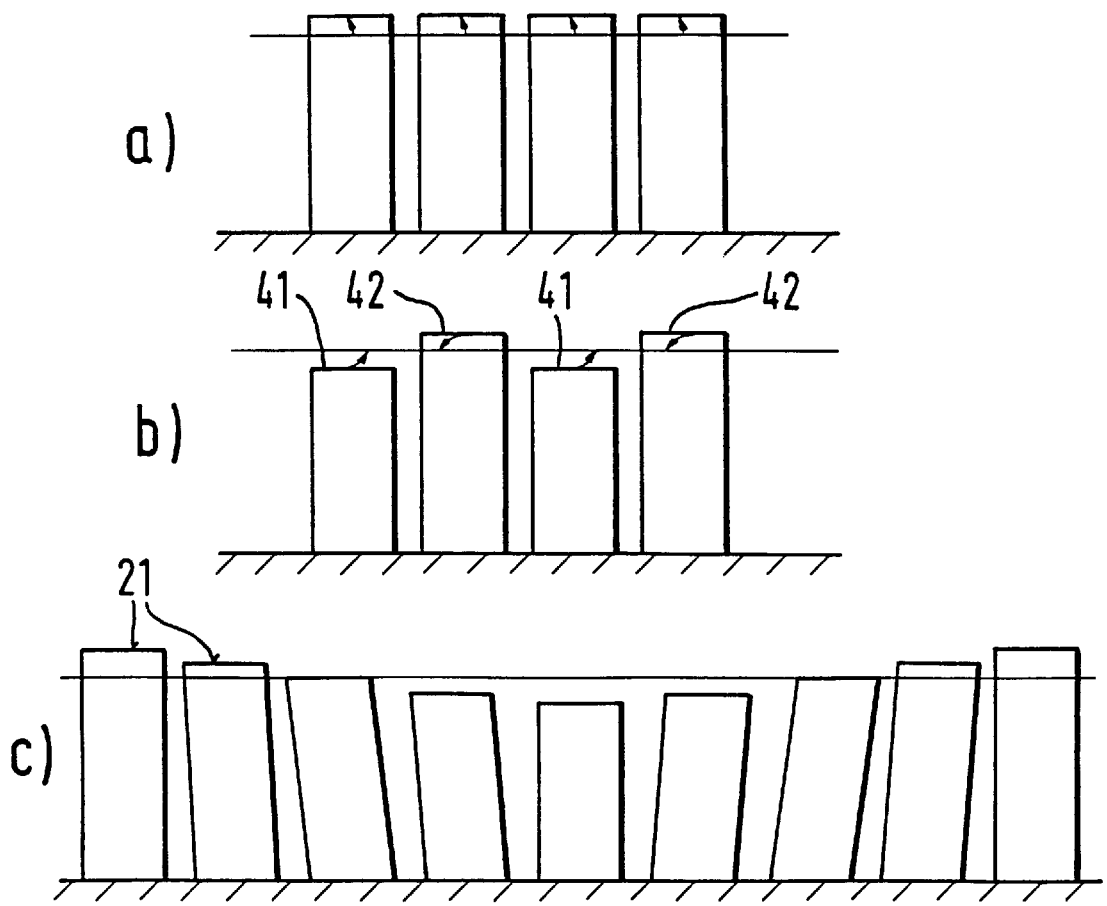
FIG. 4a shows a first form of the drive element constructed from multiple turrets.
FIG. 4b shows a second form of the drive element constructed from multiple turrets.
FIG. 4c shows a third form of the drive element constructed from multiple turrets.
FIG. 4d shows a fourth form of the drive element constructed from multiple turrets.
FIG. 4e shows a fifth form of the drive element constructed from multiple turrets.
FIG. 4f shows a sixth form of the drive element constructed from multiple turrets.
Figure 4D:
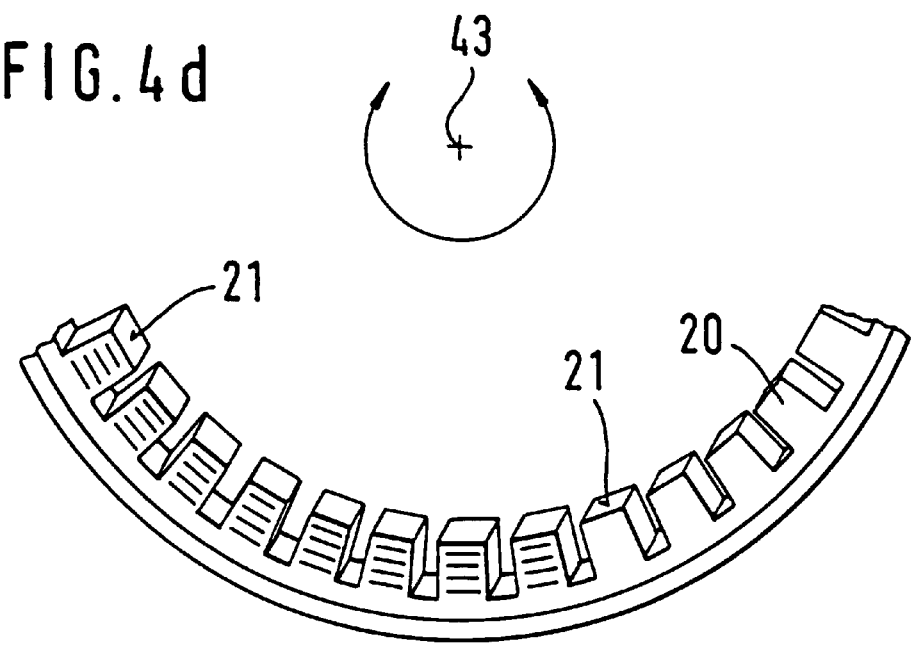

It is furthermore possible to implement rotatory drives using stacks of piezoelectric layers and contacting layers embodied in the form of turrets. FIG. 4d shows a turret row embodied in the form of a ring, in which surfaces 21 are aligned on the inside of a cylinder. The arrangement allows, in particular, rotary motions about a concentrically arranged axis 43.

Figure 4E:
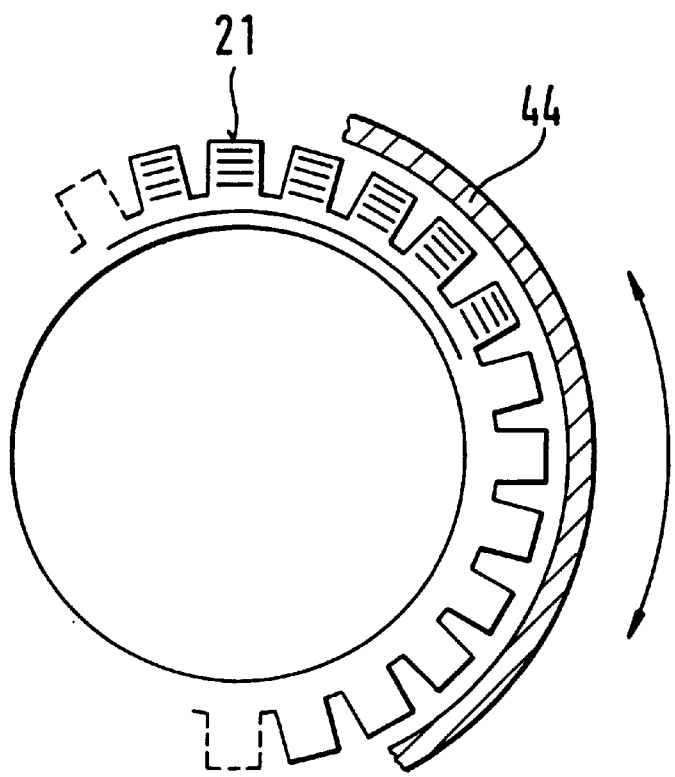

FIG. 4e shows an arrangement with turret surfaces 21 arranged on the outside of a cylinder. The arrangement allows, in particular, motions relative to the inner surface of a surrounding cylinder 44.

Figure 4F:
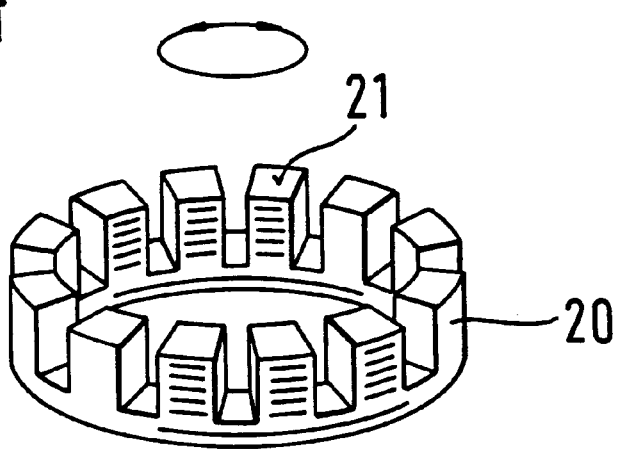

FIG. 4f shows, as a further possible embodiment, of the present invention an annular arrangement in which surfaces 21 of the turrets are arranged radially in one plane. With such an arrangement, motions of any kind can be implemented relative to the plane lying through surfaces 21 of the turrets.

A further embodiment of the drive element according to the present invention based on the use of turrets is shown in FIGS. 5a–5d, in which turrets 50 arranged next to one another are joined by bridge stacks 51. Bridge stacks 51 are constructed like turrets, but have a lower stack height. They are advantageously arranged between turrets 50 in such a way that they touch (contact) neither the element being driven nor base 59 on which turrets 50 are mounted. The electrodes of bridge stack 51 are located perpendicular to the desired elongation direction, and the secondary piezoelectric effect of transverse contraction is used; the polarization and electric fields are perpendicular to the desired longitudinal direction. Both turrets 50 and bridge stacks 51 are respectively excited into longitudinal oscillations, the oscillations excited in the bridge stacks 51 lying orthogonally to those excited in turrets 50. The motions of turrets 50 and bridge stacks 51 are once again superimposed at surfaces 21 of turrets 50 in such a way that bridge stacks 51 execute elliptical motions. Four stages of a motion of this kind are depicted in FIGS. 5a to 5d.

Figure 5:
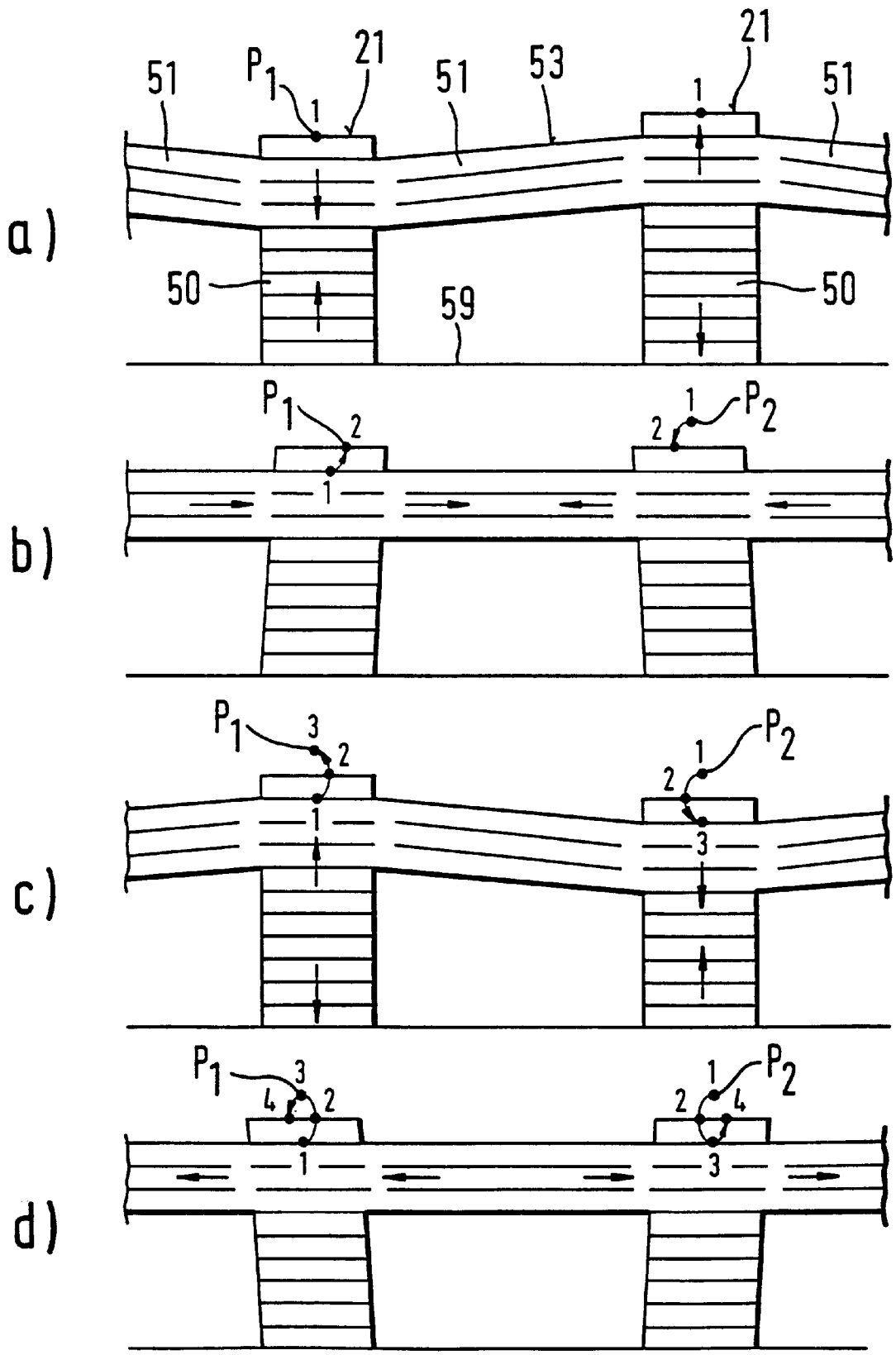
FIG. 5a shows a first position of the drive element in a sequence that is constructed from the turrets and bridge stacks.
FIG. 5b shows a second position of the drive element in a sequence that is constructed from the turrets and bridge stacks.
FIG. 5c shows a third position of the drive element in a sequence that is constructed from the turrets and bridge stacks.
FIG. 5d shows a fourth position of the drive element in a sequence that is constructed from the turrets and bridge stacks.

In the motion stage shown in FIG. 5a, left turret 50 has contracted, right turret 50 has elongated, and both are at their respective reversal points. At this point in time bridge stacks 51 are experiencing a zero transition, and are neither stretched nor elongated. In the second motion stage as shown in FIG. 5b, turrets 50 are experiencing a zero transition, i.e. are neither stretched nor elongated. Center bridge stack 51 is at the reversal point after a contraction, and the outer bridge stacks are at their respective reversal points after an elongation.

The third stage as shown in FIG. 5c corresponds to the first as shown in FIG. 5a, but the motion states of the turrets are interchanged. The left turret has elongated, and the right turret contracted. The fourth stage as shown in FIG. 5d corresponds analogously to the second, the motion states of bridge stacks 51 now being interchanged. The center one is at the reversal point after a rotation, and each of the outer bridge stacks is at the reversal point after a contraction.

As illustrated in FIGS. 5a–5d, points $P_1$ and $P_2$ located on surfaces 21 of the turrets each describe elliptical motion paths in this motion sequence. The embodiment depicted in FIGS. 5a–5d is particularly easy to manufacture if turrets 50 and bridge stacks 51 originally terminate flush with surfaces 21, 53, i.e. are produced with a smooth surface, and a friction layer which is in contact with an element being driven is then applied onto surfaces 21 of turrets 50.

Figure 6:
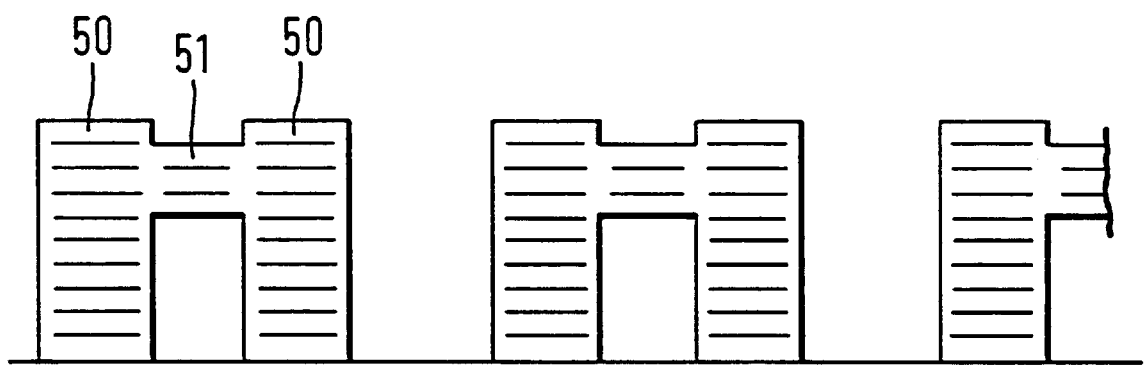
FIG. 6 shows another embodiment of the drive element constructed from the turrets and bridge stacks.

FIG. 6 shows a further embodiment of a turret/bridge stack structure according to the present invention. Here each turret 50 is joined to a neighboring turret by a bridge stack 51, yielding an H-shaped structure. There is no connection to the respective other neighboring turrets 50.

Figure 7:
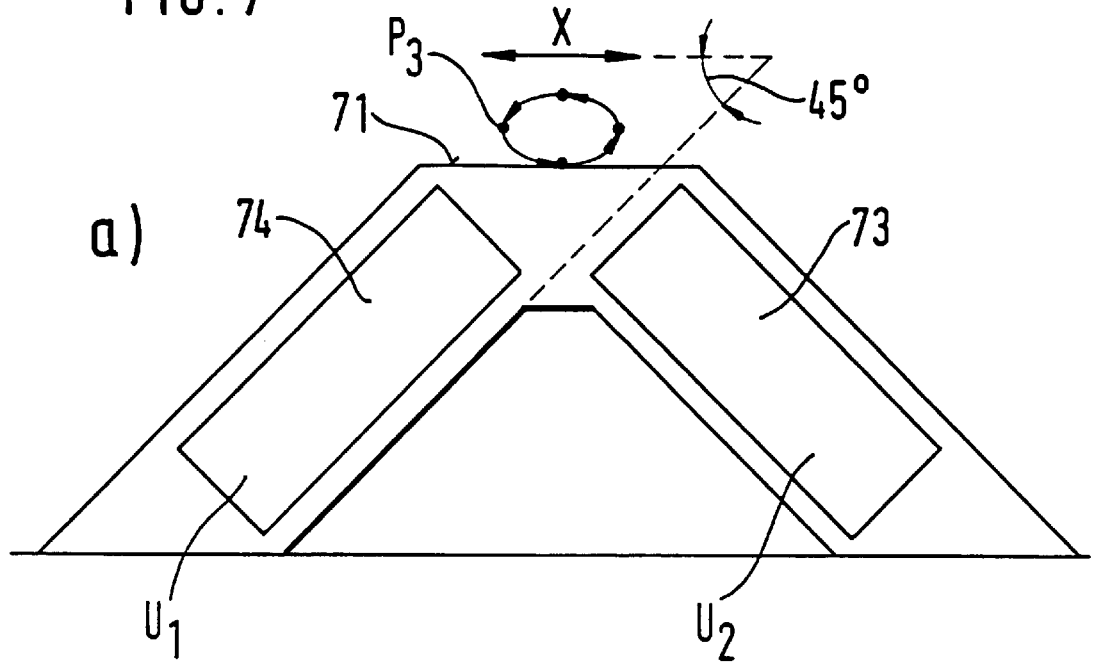
Figure 7:
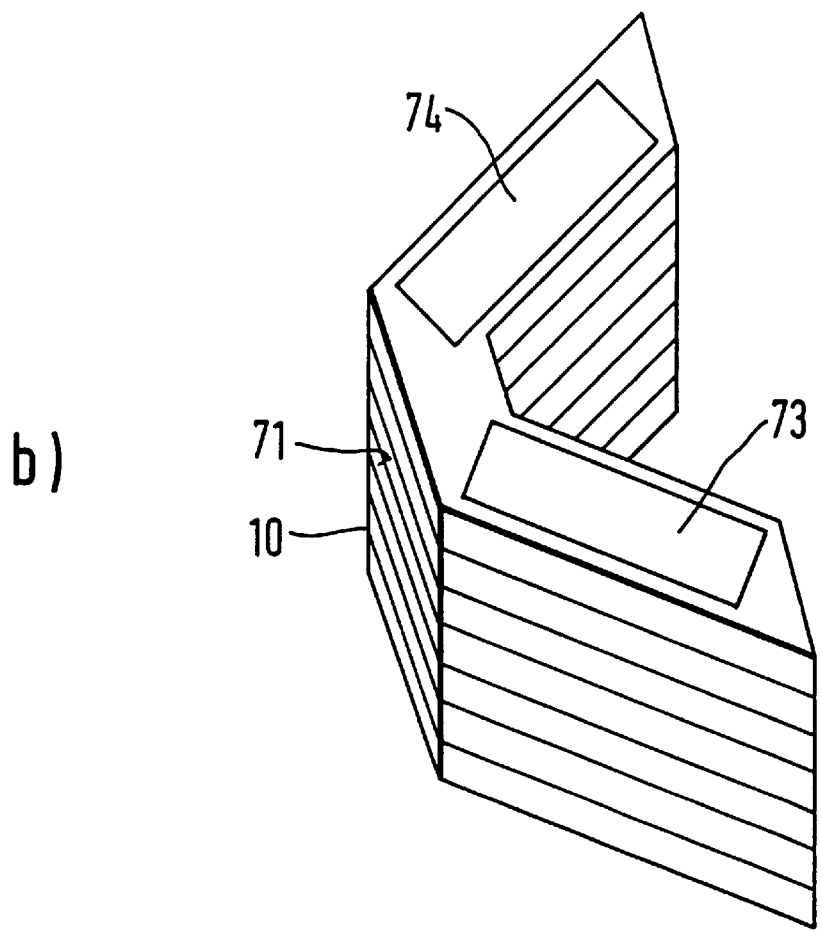

According to a further embodiment depicted in FIGS. 7a and 7b, the drive element has a V-shaped structure. Electrodes 73, 73 are configured in the contacting layers in the respective arms of the structure. In the example depicted, the angle enclosed by the arms is approximately 90°. For use, this V-shaped element is arranged so that electrodes 73, 74 are each inclined 45° with respect to the motion direction X, indicated by an arrow, of an element being driven. Drive contact takes place via a friction surface 71 configured at the end face of the V-shaped structure. The secondary piezoelectric effect is used. Electrodes 73, 74 in the arms are excited in such a way that they execute oscillations that are shifted 90° in phase from one another. The result of this at friction surface 71 is an elliptical motion sequence, as illustrated in FIG. 7a with reference to four motion stages for a point $P_3$ on friction surface 71.

Excitation of the embodiments of a drive element described above is not limited to frequencies in the subcritical or supercritical range, i.e. well below or above the natural frequencies of the excited oscillation forms, but can also take place in resonant mode, at or near the natural frequency of one of the participating oscillation forms. A consequence of such resonant excitation is that the resonantly oscillating oscillation form lags the excitation by 90°. This can be compensated for by correspondingly shifting the pertinent first alternating-current voltage by 90° with respect to the second alternating-current voltage. The advantageous result of the shift is that both oscillation forms can be excited by an excitation having the same phase position. A resonant excitation of this kind is, however, difficult to tune and comparatively subject to disruption.

A further possibility for activating a proposed drive element includes performing the excitation at a frequency which lies between the natural frequencies of the relevant oscillation forms. Here one oscillation form (ideally) lags behind the excitation with a phase shift of 180°, while the other oscillation form (ideally) tracks the excitation with no phase offset. The motion of the ellipse at the surface is thus retained, but its circulation direction is reversed. An intercritical excitation of this kind thus offers an advantageous way of reversing the motion direction.

It is advantageous to activate the drive element in such a way that both oscillation forms are resonantly excited simultaneously. This is possible if the natural frequencies of the relevant oscillation modes involved are identical, which is particularly the case with the V-shape depicted in FIGS. 7a and 7b. There is ideally a phase offset of 90° for both oscillation forms, and the elliptical motion of the surface is retained. This activation variant is very attractive because of the resonance-related amplitude increase. Once again, however, an excitation frequency of this kind is difficult to tune. The formation of beats between the excited oscillations must, in particular, be avoided. This results in an energy exchange between the oscillations in the form of a superimposed beat oscillation, and the two oscillations involved are amplitude-modulated in phase-shifted fashion in accordance with its frequency. As a result, the elliptical motion of the surface of the turret periodically degenerates into a translational motion with no component in the desired drive direction.

One way of configuring a drive element so as to make possible a simultaneous resonant excitation of all the oscillation forms participating in generation of the surface motion is by dimensioning the turrets geometrically in such a way that the natural frequencies of the participating oscillation forms are sufficiently different from one another. Advantageously, the geometrical configuration is such that the frequencies required for oscillation excitation are related in an integral ratio, for example 1:2. The motion form which results for the surface points of a turret is then a figure-eight. As in the case of the elliptical motion, the component contained in the "upper part" of this motion parallel to the surface of the turret is used to generate a drive moment. The excitation voltages can be applied to the same electrodes, and are superimposed there. Reversal of the motion can be achieved by controlling the phase difference.

Figure 12:
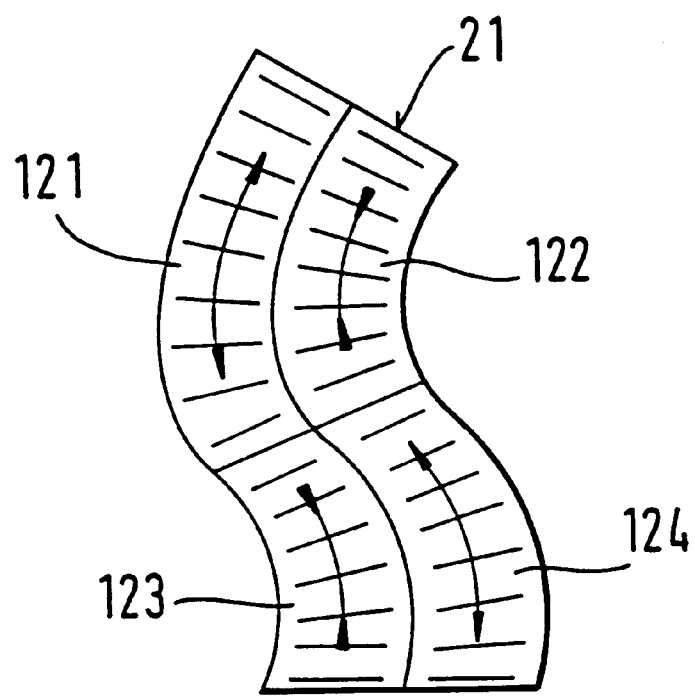
FIG. 12 shows the drive element suitable for exciting the second flexural mode according to the present invention.

Another way of making possible simultaneous resonant excitation of several oscillations needed to generate a surface motion is indicated in FIG. 12. Here the flexural oscillation excitation occurs in such a way that the flexural mode excited is not the first, but the second or optionally higher one. Although the higher flexural modes have a reduced amplitude as compared with the first, their natural frequencies are higher. The second or higher flexural oscillation mode, and a longitudinal oscillation, can thus be excited simultaneously in resonant fashion, thus balancing out the disadvantage of the lower amplitude of the second flexural mode. For this purpose the turret is, as shown in FIG. 12, divided into at least four regions 121 to 124, which are then activated in such a way that the second flexural mode is excited with respect to the flexural oscillation. With four regions 121 to 124 as shown in FIG. 12, this is achieved by exciting diagonally opposite regions 121, 124 with, for example, a voltage $U_3=+A\cdot\cos(\omega t)$, and the other two diagonally opposite regions 122, 123 with $U_4=-A\cdot\cos(\omega t)$, where A is the amplitude of the excitation voltage. The respective excitation voltage for exciting the longitudinal oscillation is additionally superimposed on this excitation voltage.

The higher natural frequency of the second flexural oscillation also has the advantage that it lies well above the human hearing threshold, and moreover well above the hearing threshold of many animals. The result is that the noise generated by the drive is considerably reduced for all.

Figure 8:
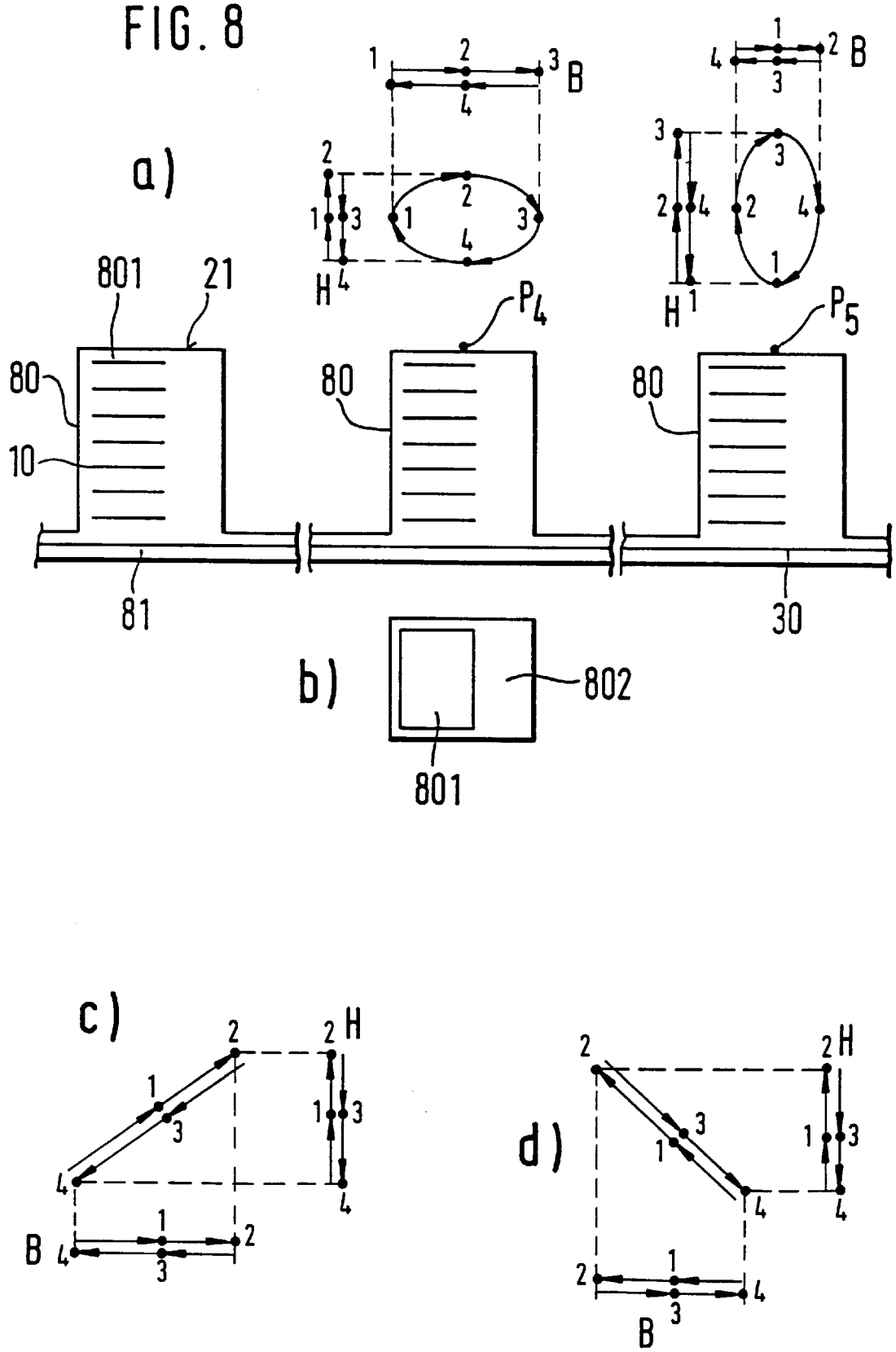

FIGS. 8a and 8b show a further embodiment of the drive element illustrated in FIG. 1. The drive element includes again of a plurality of turrets 80, arranged next to one another in crenellated fashion, which are connected by means of a common base 81 having at least one continuous piezoelectric layer 30. Of the piezoelectric layers 10 indicated by horizontal lines, however, only a subregion 801 in each case is contacted by means of an electrode arrangement. The other region 802 in each case is not electrically contacted. Layers 10 are divided into regions 801, 802 asymmetrically, as depicted in FIG. 7b with reference to a cross section through a turret along a piezoelectric layer 10. In the example, electrically contacted region 801 is larger than uncontacted region 802, but it can also be smaller. The advantage of the arrangement as shown in FIGS. 8a and 8b is that it can be activated by means of only a single control voltage. Because of the asymmetry caused by the division into unequal regions, two different oscillation forms are excited even if only one alternating-current voltage is applied. Turrets 80 once again each execute both a linear motion H and a flexural motion B. The configuration of the overall motion thus resulting by superimposition at surface 83 depends on the frequency of the alternating-current voltage used for excitation. If excitation occurs at or near the resonant frequency of the flexural oscillation, and if the latter is (as is always assumed hereinafter) lower than the resonant frequency of the longitudinal oscillation, the flexural motion lags 90° behind the excitation. With this assumption, the longitudinal oscillation is still subcritical; it does not lag behind the excitation (or does so only slightly). The result, although excitation is occurring with only one alternating-current voltage, is once again both a longitudinal oscillation H and a flexural oscillation B shifted 90° in phase from it. Surface 83 of a turret 80 thus executes an elliptical motion, usable for a drive, in a plane perpendicular to the dividing line between regions 801 and 802. Because of the resonant or at least approximately resonant excitation of the flexural oscillation, its amplitude is exaggerated. The motion executed by surface 21 therefore corresponds to a flattened ellipse. The manner in which it occurs is illustrated, above the center turret 80 in FIG. 8a, with reference to four motion stages of a surface point $P_4$. The influence of linear oscillation H on the resulting motion path is shown to the left of the ellipse, and the influence of flexural oscillation B above the ellipse.

If the frequency of the excitation voltage is set at or near the resonant frequency for the longitudinal oscillation, surface 21 of a turret 70 moves along an ellipse that is elongated perpendicular to surface 73. Flexural oscillation B then (theoretically) lags 180° behind the excitation, and longitudinal oscillation H lags by 90°. The resulting motion path of a surface point $P_5$ and the way in which it occurs by the interaction of linear oscillation H and flexural oscillation B is depicted above the right turret, once again in the form of four motion stages.

If the excitation occurs for both oscillation forms either subcritically, i.e. at a frequency which is much lower than the resonant frequencies of the two oscillation forms, or supercritically, i.e. at a frequency which is much greater than the resonant frequencies of the oscillation forms, surface 21 of turret 80 executes an approximately linear motion which can extend, for example, from bottom left to top right. FIG. 8c shows, in the form of a motion stage diagram, how such a motion occurs in response to a linear oscillation H and a flexural oscillation B. A motion in the opposite direction, i.e. for example from top left to bottom right, is achieved by applying the excitation at a frequency which lies between the natural frequencies of the flexural oscillation and longitudinal oscillation. The manner in which this occurs is illustrated in FIG. 8d, which shows the motion of a point under the influence of linear oscillation H and flexural oscillation B, and of the resultant.

A variety of drive directions and drive mechanisms can be achieved with an arrangement as shown in FIGS. 8a and 8b by appropriate selection of the frequency of the excitation voltage. For example, a drive operating on the plunger principle with a reversible motion direction can be implemented by correspondingly alternating excitation at a frequency in the subcritical range and at a frequency in the intercritical range. Selecting a first excitation frequency at or near the natural frequency of one of the occurring oscillation modes, and a second frequency in the intercritical range, yields a drive which has an elliptical actuator motion in one motion direction, and operates on the plunger principle in the other direction.

The individual turrets 70 of a drive element can be activated in the same fashion as discussed with reference to FIG. 4 for turrets excited in two-phase nonresonant fashion.

Figure 9:
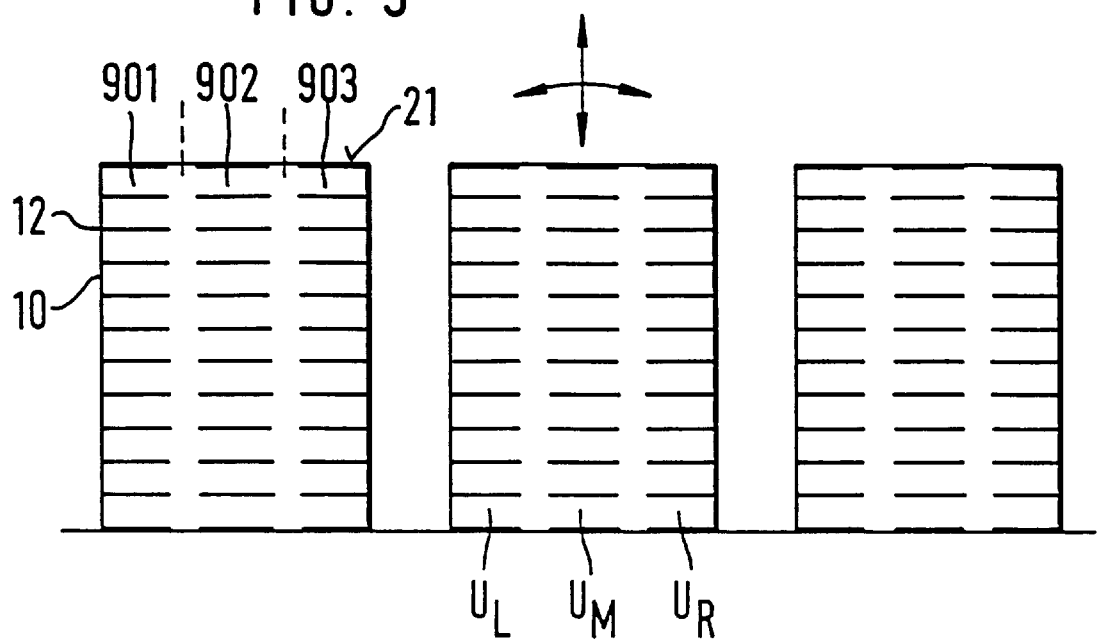
FIG. 9 shows yet another embodiment of the drive element excitable in single-phase fashion according to the present invention having three electrodes per layer.

FIG. 9 shows a further embodiment of a drive element according to the present invention that can be controlled in single-phase fashion. Here layers 10 are each divided into three regions 901, 902, 903. Activation is carried out in such a way that the two outer regions 801, 803 are in each case activated in opposite directions, i.e. with $U_L=+U$ and $U_R=-U$, where $U=U_0 \sin(\omega t)$. Depending on the desired resulting motion direction, center region 902 is activated in the same way as one of the outer regions 901, 903, i.e. with $U_M=U_R$ for a drive output to the left, or with $U_M=U_L$ for drive output to the right. This can be effected by a simple reversal in the electronics. Once again, therefore, a single excitation voltage is sufficient. Assuming that the natural frequency of the flexural oscillation is lower than that of the longitudinal oscillation, excitation preferably occurs at or near the natural frequency of the flexural oscillation. An elliptical motion of surface 21 is produced, in the same way as described with reference to FIG. 8a. The circulation direction of the resulting motion ellipse can be reversed by changing the activation of center part 902.

Figure 10:
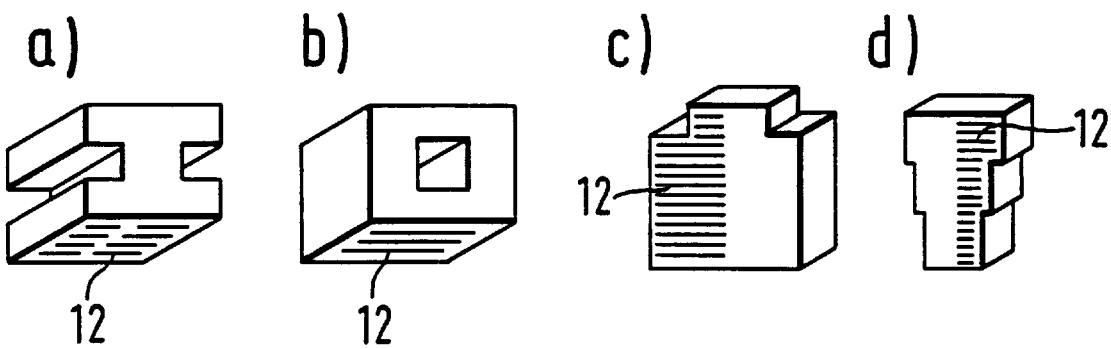
FIG. 10a shows a first configuration of the drive element according to the present invention.
FIG. 10b shows a second configuration of the drive element according to the present invention.
FIG. 10c shows a third configuration of the drive element according to the present invention.
FIG. 10d shows a fourth configuration of the drive element according to the present invention.

The shape of the drive elements can moreover be freely selected within wide limits. FIGS. 10a and 10b show examples of turrets with a freely configured geometry of layers 10, and FIGS. 10c and 10d show examples of turrets with a layer cross section which varies with height.

Figure 11:
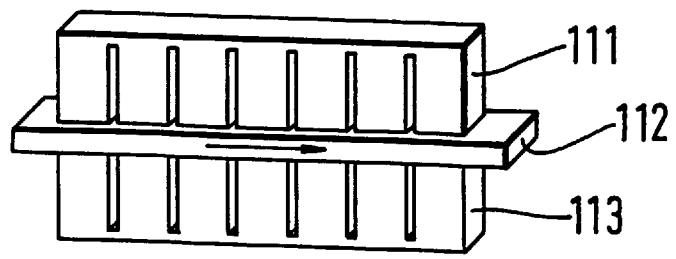
FIG. 11 shows an arrangement for driving an object.

The mounting of the drive element, and the principle by which power is transferred to the part being driven, are not described here. All known methods are, in principle, possible. One example of a solution for a drive using two drive elements 1001, 1002 in the form of turret rows is shown in FIG. 11. Part 112 being driven is located between drive elements 111, 113, which drive it from two sides. In order reliably to maintain sufficient contact pressure, the arrangement shown in FIG. 11 can be pressed by a resilient clamp against part 112 being driven. In this context, arrangement 111, 113 can be mounted in floating fashion on part 112 being driven.

What is claimed is:

1. An ultrasonic drive element comprising:
   a plurality of piezoelectric layers, a first piezoelectric layer of the plurality of piezoelectric layers arranged on top of a second piezoelectric layer of the plurality of piezoelectric layers to form a layer stack; and
   a contacting layer including at least two subregions and being positioned between the first piezoelectric layer and the second piezoelectric layer, each subregion including at least one electrode, the electrode contacting the first and second piezoelectric layers and receiving a respective operating alternating-current voltage that excites a surface of the layer stack to generate mechanical oscillations, each of the mechanical oscillations having a respective motion component parallel to a plane of the surface of the layer stack,
   wherein the respective alternating-current voltage includes a first voltage for exciting the layer stack to generate longitudinal oscillations, the first voltage being applied to at least a first portion of the at least one electrode,
   wherein the respective alternating-current voltage includes a second voltage, wherein the second voltage is shifted 90 degrees with respect to the first voltage,
   wherein the plurality of piezoelectric layers are arranged in turret-like stacks, a first stack of the turret-like stacks being crenellate-positioned next to a second stack of the turret-like stacks on at least one common piezoelectric base layer and being activated so that the first stack is polarized in a same direction as the second stack.

2. An ultrasonic drive element comprising:
   a plurality of piezoelectric layers, a first piezoelectric layer of the plurality of piezoelectric layers situated on top of a second piezoelectric layer of the plurality of piezoelectric layers to form a layer stack; and
   a contacting layer including at least two subregions and being situated between the first piezoelectric layer and the second piezoelectric layer, each of the subregions including at least one electrode, the at least one electrode contacting the first and second piezoelectric layers and receiving a respective operating alternating-current voltage that excites a surface of the layer stack to generate mechanical oscillations,
   wherein the respective alternating-current voltage includes a first voltage for exciting the layer stack to generate longitudinal oscillations, the first voltage being applied to at least a first portion of the at least one electrode,
   wherein the respective alternating-current voltage includes a second voltage, and
   wherein the plurality of piezoelectric layers are situated in turret-like stacks, a first stack of the turret-like stacks being crenellate-positioned next to a second stack of the turret-like stacks on at least one common piezoelectric base layer and being activated so that a polarization of the first stack is tuned to a polarization of the second stack.

3. The ultrasonic drive element according to claim 2, wherein each of the mechanical oscillations of the layer stack has a respective motion component parallel to a plane of a surface of the layer stack.

4. The ultrasonic drive element according to claim 2, wherein the second voltage is shifted 90 degrees with respect to the first voltage.

5. The ultrasonic drive element according to claim 2, wherein the second voltage is shifted 180 degrees with respect to the first voltage.

6. The ultrasonic drive element according to claim 2, wherein the first and second stacks are activated so that the first stack is polarized in a same direction as the second stack.

7. The ultrasonic drive element according to claim 2, wherein the turret-like stacks are annularly arranged.

8. The ultrasonic drive element according to claim 2, wherein all of the turret-like stacks are activated in a same manner.

9. The ultrasonic drive element according to claim 2, wherein the turret-like stacks are activated so that adjacent turrets move in appositive directions.

10. The ultrasonic drive element according to claim 2, wherein the first stack is coupled to the second stack via a bridge stack.

11. The ultrasonic drive element according to claim 10, wherein the turret-like stacks and the bridge stack are excited to provide mutually orthogonal longitudinal oscillations.

12. The ultrasonic drive element according to claim 2, wherein the respective alternating-current voltage includes a frequency substantially corresponding to a resonant frequency for the longitudinal oscillations, the respective alternating-current voltage being applied to the at least one electrode.

13. The ultrasonic drive element according to claim 2, wherein the at least two subregions include three adjacent subregions, respective alternating-current voltages having opposite polarity being applied to outer portions of the three adjacent subregions, a respective alternating-current voltage having a predetermined polarity that generates a desired movement direction being applied to a center region of the three adjacent subregions.

14. The ultrasonic drive element according to claim 2, wherein the layer stack has predetermined dimensions and the first voltage and the second voltage are of different frequencies to simultaneously excite bending oscillations and longitudinal oscillations.

15. The ultrasonic drive element according to claim 2, wherein the electrode of the first subregion contacts the second subregion, the second subregion being electrically insulated, wherein the first subregion has a different site than the second subregion, the electrode being activated using alternating-current voltages which simultaneously excite a linear motion and a flexural motion in the layer stack.

16. The ultrasonic drive element according to claim 15, wherein the electrode of the first subregion contacts a first area of the second subregion, the first area being separate from an insulated area of the second subregion.

* * * * *

UNITED STATES PATENT AND TRADEMARK OFFICE
CERTIFICATE OF CORRECTION

PATENT NO. : 6,066,911
DATED : May 23, 2000
INVENTOR(S) : Gert Lindemann, et al.

It is certified that error appears in the above-identified patent and that said Letters Patent is hereby corrected as shown below:

Column 2, line 14, delete "underlying".

Signed and Sealed this

Twenty-second Day of May, 2001

Attest:

NICHOLAS P. GODICI

Attesting Officer

Acting Director of the United States Patent and Trademark Office